United States Patent
Wang et al.

(10) Patent No.: US 10,412,831 B2
(45) Date of Patent: Sep. 10, 2019

(54) CIRCUIT BOARD AND LAYOUT STRUCTURE

(71) Applicant: Wistron Corporation, New Taipei (TW)

(72) Inventors: Chang-Chun Wang, New Taipei (TW); Su-Kai Hsu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/917,864

(22) Filed: Mar. 12, 2018

(65) Prior Publication Data

US 2019/0159340 A1 May 23, 2019

(30) Foreign Application Priority Data

Nov. 22, 2017 (TW) .............................. 106140429 A

(51) Int. Cl.
| | |
|---|---|
| *H05K 1/11* | (2006.01) |
| *H05K 1/14* | (2006.01) |
| *H05K 1/18* | (2006.01) |
| *G06F 17/50* | (2006.01) |
| *H05K 3/00* | (2006.01) |
| *H05K 1/02* | (2006.01) |

(52) U.S. Cl.
CPC .......... *H05K 1/111* (2013.01); *G06F 17/5072* (2013.01); *H05K 1/181* (2013.01); *H05K 3/0005* (2013.01); *H05K 1/0243* (2013.01); *H05K 1/14* (2013.01); *H05K 2201/09227* (2013.01); *H05K 2201/09445* (2013.01); *H05K 2201/10098* (2013.01); *H05K 2201/10159* (2013.01)

(58) Field of Classification Search
CPC .......... H05K 1/14; H05K 1/141; H05K 1/142; H05K 1/144; H05K 1/145; H05K 2201/09227; H05K 2201/09236; H05K 2201/09245; H05K 2201/09272
See application file for complete search history.

(56) References Cited

U.S. PATENT DOCUMENTS

| | | | | |
|---|---|---|---|---|
| 4,220,917 A | * | 9/1980 | McMahon, Jr. ...... | G01R 31/024 257/773 |
| 4,489,364 A | * | 12/1984 | Chance ............... | H01L 23/5382 257/E23.171 |
| 4,658,332 A | * | 4/1987 | Baker .................. | H05K 1/0271 174/255 |
| 4,967,262 A | * | 10/1990 | Farnsworth ....... | H01L 23/49555 257/678 |
| 5,122,475 A | * | 6/1992 | Heckaman ............ | H01L 23/057 257/E23.083 |

(Continued)

*Primary Examiner* — Hoa C Nguyen
(74) *Attorney, Agent, or Firm* — JCIPRNET

(57) ABSTRACT

A circuit board and a layout structure are provided. The layout structure includes a plurality of chip carrying areas, a plurality of inner layer connection pads and a plurality of outer leading wires. The chip carrying areas respectively carry a plurality of chips. The outer leading wires are disposed between the inner layer connection pads and the chip carrying areas. The layout structure is disposed on at least one circuit board and connects to a plurality of wires of the at least one circuit board through the outer leading wires, and the outer leading wires and the wires of the at least one circuit board are formed by sharing at least one metal layer.

18 Claims, 5 Drawing Sheets

(56) References Cited

U.S. PATENT DOCUMENTS

| | | | | |
|---|---|---|---|---|
| 5,177,863 | A * | 1/1993 | Lam | H01L 23/13 |
| | | | | 174/254 |
| 6,147,876 | A * | 11/2000 | Yamaguchi | H01L 23/24 |
| | | | | 257/698 |
| 9,831,144 | B2 * | 11/2017 | Podval | H01L 23/49838 |
| 2003/0042585 | A1 * | 3/2003 | Corisis | H01L 23/5385 |
| | | | | 257/668 |
| 2006/0087013 | A1 * | 4/2006 | Hsieh | H01L 25/0652 |
| | | | | 257/678 |
| 2008/0315377 | A1 * | 12/2008 | Eichelberger | H01L 21/6835 |
| | | | | 257/660 |
| 2010/0230806 | A1 * | 9/2010 | Huang | H01L 23/50 |
| | | | | 257/723 |
| 2016/0172293 | A1 * | 6/2016 | Shelsky | H01L 23/49838 |

* cited by examiner

United States Patent document US 10,412,831 B2

CIRCUIT BOARD AND LAYOUT STRUCTURE

CROSS-REFERENCE TO RELATED APPLICATION

This application claims the priority benefit of Taiwan application serial no. 106140429, filed on Nov. 22, 2017. The entirety of the above-mentioned patent application is hereby incorporated by reference herein and made a part of this specification.

BACKGROUND OF THE INVENTION

Field of the Invention

The invention relates to a circuit board and a layout structure, and particularly relates to a layout structure of a circuit board of a virtual system on module (vSOM).

Description of Related Art

Referring to FIG. 1, FIG. 1 is a structural diagram of a system on module (SOM) of a conventional technique. In order to integrate a plurality of chips in a single module, in the conventional technique, a carrier board 110 is applied to carry chips 111 and 112, and a wire layout of the chips 111 and 112 inside the module and outside the module is arranged on the carrier board 110. In an application, the carrier board 110 may be configured on a surface of a circuit board 1120 through a connector or a surface mount technology (SMT), and the chips 111 and 112 may be electrically connected to electronic components on the circuit board 120.

In such type of the SOM 100, in order to accommodate the SOM 100, an electronic device requires to have a larger space, which is a challenge for the requirement of a thin-type design of the electronic device.

SUMMARY OF THE INVENTION

The invention is directed to a layout structure, which reduces an authentication cost of an electronic device.

The invention provides a layout structure including a plurality of chip carrying areas, a plurality of inner layer connection pads and a plurality of outer leading wires. The chip carrying areas respectively carry a plurality of chips. The inner layer connection pads are disposed on at least one edge of the layout structure. The outer leading wires are disposed between the inner layer connection pads and the chip carrying areas. The layout structure is disposed on at least one first circuit board and is connected to a plurality of wires of the at least one first circuit board through the outer leading wires, and the outer leading wires and the wires of the at least one first circuit board are formed by sharing at least one first metal layer.

In an embodiment of the invention, the layout structure further includes a plurality of inner leading wires. The inner leading wires are disposed between the chip carrying areas, wherein the layout structure has a distribution range, and the chip carrying areas and the inner leading wires are all integrally disposed in the distribution range.

In an embodiment of the invention, the inner layer connection pads are disposed on the at least one edge of the distribution range.

In an embodiment of the invention, the inner layer connection pads are divided into a plurality of connection point groups corresponding to a plurality of signal types. The connection point groups are respectively disposed in a plurality of regions of the at least one edge of the layout structure.

In an embodiment of the invention, each of the outer leading wires is a mobile industry processor interface (MIPI) wire, a general purpose input output (GPIO) interface wire, a radio frequency (RF) signal input output wire or a serial transmission interface wire.

In an embodiment of the invention, when each of the outer leading wires is the (MIPI) wire or the GPIO interface wire, each of the outer leading wires is arranged in an orthogonal junction manner within the distribution range.

In an embodiment of the invention, each of the outer leading wires extends along a first direction for connecting the corresponding inner layer connection pad, and the at least one edge corresponding to the corresponding inner layer connection pad extends along a second direction, wherein the first direction is substantially orthogonal to the second direction.

In an embodiment of the invention, the number of times that each of the outer leading wires passes through the at least one edge of the distribution range of the layout structure is not greater than 1.

In an embodiment of the invention, each of the chip carrying areas is used for carrying a central processing unit, a power management integrated circuit, a RF signal processing chip or a memory chip.

In an embodiment of the invention, the inner leading wires include a plurality of voltage rail wires and at least one critical path wire, wherein the voltage rail wires are used for providing a power voltage to the chip carrying areas.

In an embodiment of the invention, the layout structure is further disposed on at least one second circuit board, and the at least one first circuit board and the at least one second circuit board are different. The layout structure is connected to a plurality of wires of the at least one second circuit board through the outer leading wires. The outer leading wires and the wires of the at least one second circuit board are arranged by sharing at least one second metal layer.

In an embodiment of the invention, distribution ranges of the layout structure on the at least one first circuit board and on the at least one second circuit board are the same.

The invention provides a circuit board including a plurality of wires and at least one layout structure. The layout structure includes a plurality of chip carrying areas, a plurality of inner layer connection pads and a plurality of outer leading wires. The chip carrying areas respectively carry a plurality of chips. The inner layer connection pads are disposed on at least one edge of the layout structure. The outer leading wires are disposed between the inner layer connection pads and the chip carrying areas. The layout structure is disposed on the circuit board and is connected to the wires of the circuit board through the outer leading wires, and the outer leading wires and the wires of the circuit board are formed by sharing at least one first metal layer.

According to the above description, the invention provides a circuit board and a layout structure, and the layout structure forms a virtual system on module (vSOM). The layout structure includes chip carrying areas, inner leading wires, inner layer connection pads and outer leading wires. The outer leading wires and the wires of the circuit board share a metal layer for layout, and the outer leading wires are connected to the wires of the circuit board. Under a condition that a height of the circuit board is not increased, the vSOM may be disposed on different types of circuit boards, and a design cost is decreased. Moreover, when authentication of the circuit board is performed, it is unnecessary to repeatedly authenticate the vSOM, so that the cost and time required for authentication are reduced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
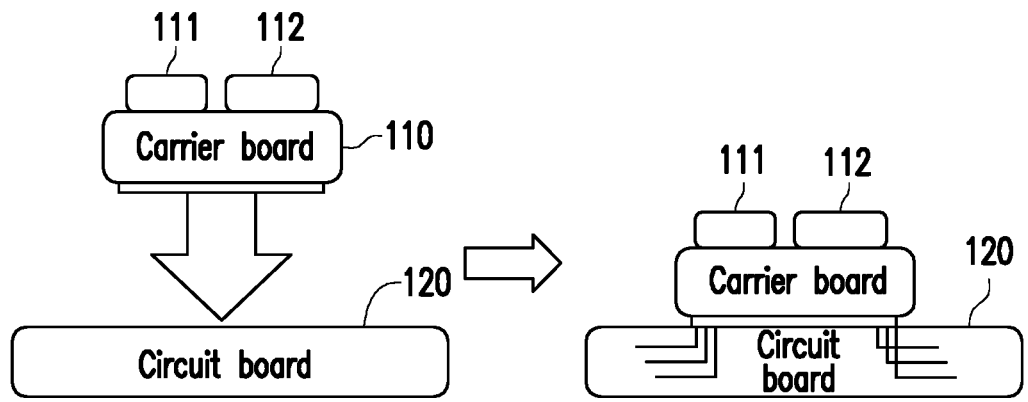
FIG. 1 is a structural diagram of a system on module (SOM) of a conventional technique.
Figure 2:
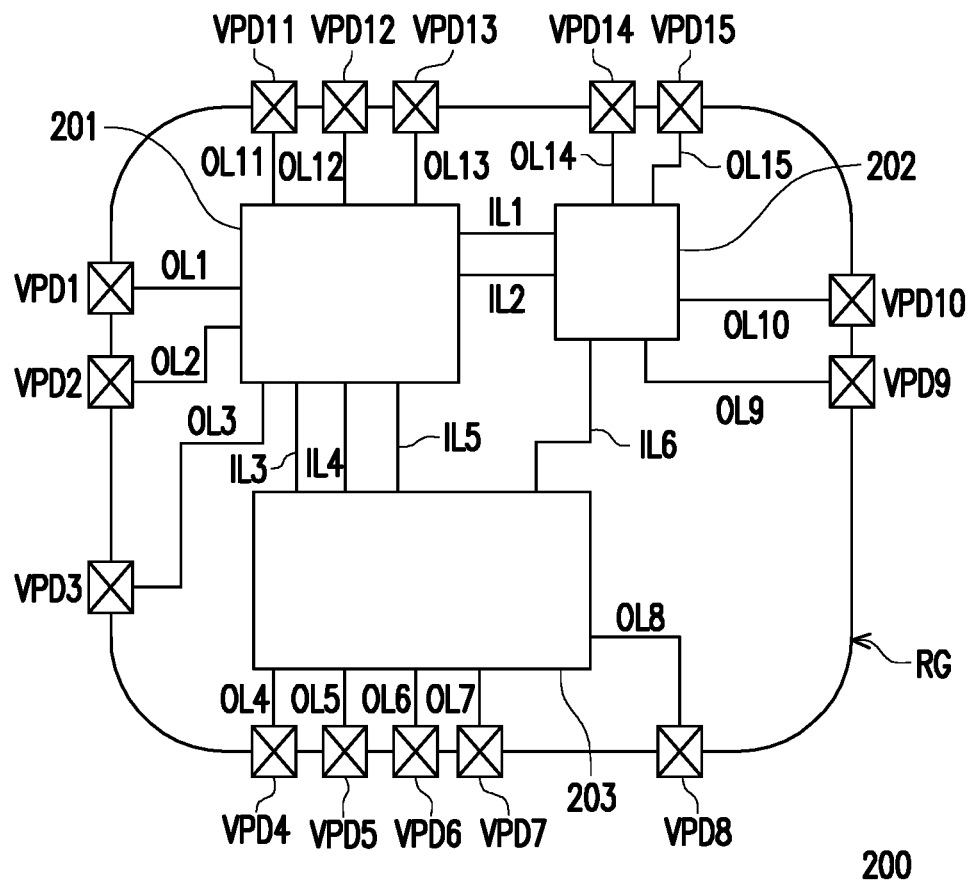
FIG. 2 is a schematic diagram of a layout structure according to an embodiment of the invention.

Referring to FIG. 2, FIG. 2 is a schematic diagram of a layout structure according to an embodiment of the invention. The layout structure 200 includes chip carrying areas 201-203, inner leading wires IL1-IL6, outer leading wires OL1-OL15 and inner layer connection pads VPD1-VPD15. The layout structure 200 has a distribution range RG. The chip carrying areas 201-203 and the inner leading wires IL1-IL6 are integrally disposed in the distribution range RG. The inner layer connection pads VPD1-VPD15 may be disposed on one or more edges of the distribution range RG. The outer leading wires OL1-OL15 are respectively disposed between the inner layer connection pads VPD1-VPD15 and the chip carrying areas 201-203. The inner layer connection pads VPD1-VPD15 are used as virtual connection pads, and serve as reference connection pads of the layout structure 200 for configuring the outer leading wires OL1-OL15.

Further, the chip carrying areas 201-203 are used for respectively carrying a plurality of chips. In the embodiment of the invention, each of the chip carrying areas 201-203 may be used for carrying a central processing unit (CPU), a power management integrated circuit (PMIC), a radio frequency (RF) signal processing chip or a memory chip. The RF signal processing chip may be a RF signal transceiver chip or a RF signal front end (RF) circuit chip. The memory chip may be any type of a memory circuit chip, or may be an embedded multimedia card chip.

The inner leading wires IL1-IL6 are used as transmission lines for signal and/or power transmission between the chips respectively carried on the chip carrying areas 201-203. In the present embodiment, the inner leading wires IL1 and IL2 are coupled between the chip carrying areas 201 and 202, the inner leading wires IL3-IL5 are coupled between the chip carrying areas 201 and 203, and the inner leading wire IL6 is coupled between the chip carrying areas 202 and 203.

On the other hand, the outer leading wires OL1-OL15 are used as transmission lines for signal and/or power transmission between the chips respectively carried on the chip carrying areas 201-203 and electronic components outside the layout structure 200. The outer leading wires OL1-OL15 are electrically connected to the electronic components outside the layout structure 200 through the inner layer connection pads VPD1-VPD15.

Figure 3A:
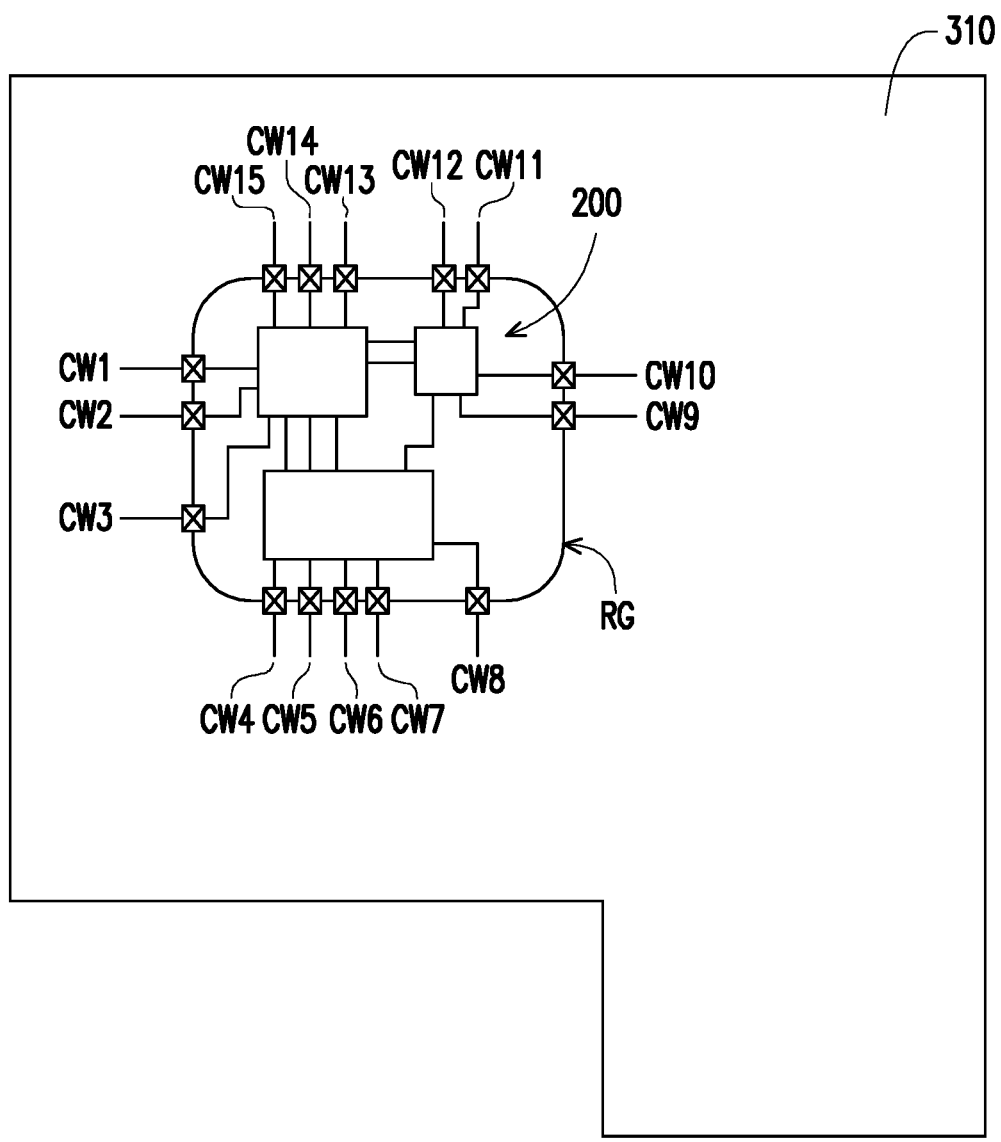
FIG. 3A is a schematic diagram of a configuration relationship of the layout structure 200 and a circuit board according to an embodiment of the invention.

Referring to FIG. 2 and FIG. 3A, FIG. 3A is a schematic diagram of a configuration relationship of the layout structure 200 and a circuit board according to an embodiment of the invention. In FIG. 3A, the layout structure 200 is disposed on the circuit board 310, and the layout structure 200 is connected to the circuit board 310 through the outer leading wires OL1-OL15. The outer leading wires OL1-OL15 of the layout structure 200 are respectively connected to a plurality of wires CW1-CW15 on the circuit board 310. The point is, the outer leading wires OL1-OL15 and the wires CW1-CW15 of the circuit board 310 are arranged by sharing a same layer or multi-layer of metal layers.

Figure 3B:
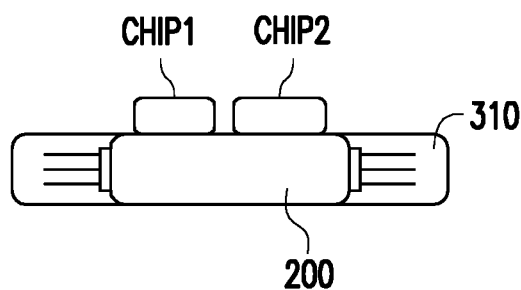
FIG. 3B is a cross-sectional view of the layout structure according to an embodiment of the invention.

Namely, in the present embodiment, the outer leading wires OL1-OL15 and the wires CW1-CW15 of the circuit board 310 are formed by sharing one layer or multi-layer of metal layers, and are not connected though connectors or through a welding manner. The layout structure 200 of the present embodiment is formed on the circuit board 310 in a manner of virtual system on module (vSOM), which does not cause an increase of an extra height (thickness) of the circuit board 310. A cross-sectional view of the embodiment of FIG. 3A is shown as a cross-sectional view of the layout structure of the embodiment of the invention of FIG. 3B. Besides the height of the chips CHIP1 and CHIP2 carried on the layout structure 200, the layout structure 200 is equivalent to be embedded in the circuit board 310, which does not cause an extra height increase.

It should be noted that as the layout structure 200 is formed by laying on the circuit board 310, the chip carrying areas 201-203 and the inner leading wires IL1-IL6 in the layout structure 200 may be formed through one or multi-layer of metal layers provided by the circuit board 310.

Referring to FIG. 2 again, in an actual design, a designer may set the chip carrying areas 201-203 to proper positions of the layout structure 200 according to a design requirement of the layout structure 200, and set the inner layer connection pads VPD1-VPD15 to proper positions on the one or more edges of the distribution range RG. Then, the designer may set the inner leading wires IL1-IL6 to connect between the chip carrying areas 201-203, and set the outer leading wires OL1-OL15 between the inner layer connection pads VPD1-VPD15 and the chip carrying areas 201-203.

The finished layout structure 200 may be applied to various different products. Namely, the finished layout structure 200 may be disposed on circuit boards of various different types or a same type. In FIG. 3A, when the layout structure 200 is disposed on the circuit board 310, the designer only requires to respectively connect the wires CW1-CW15 of the circuit board 310 to the corresponding inner layer connection pads VPD1-VPD15, and is unnecessary to change a layout architecture of the layout structure 200, which effectively simplifies a design complexity.

Figure 4A:
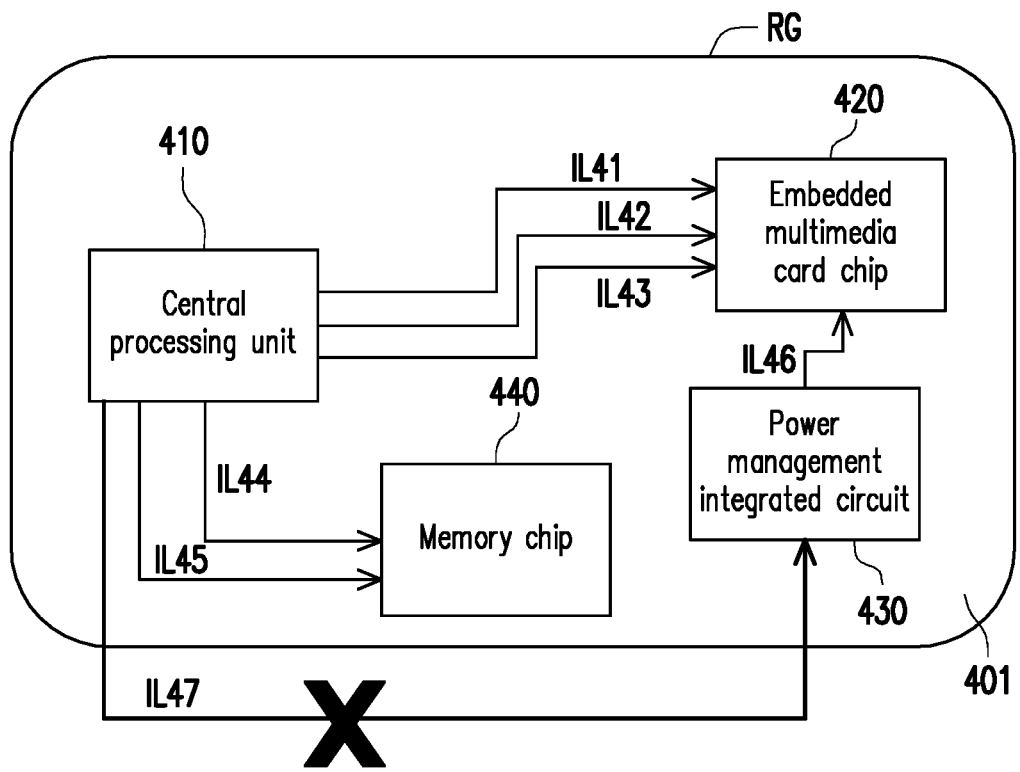
FIG. 4A and FIG. 4B respectively illustrate configuration methods of inner leading wires and outer leading wires of the layout structure according to an embodiment of the invention.
Figure 4B:
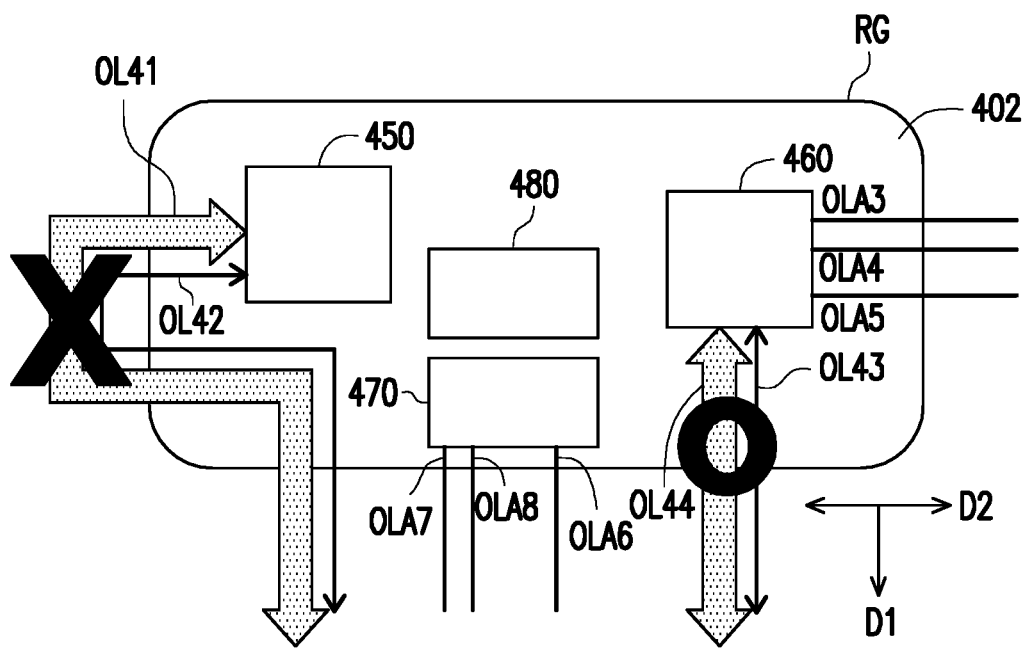

Referring to FIG. 4A and FIG. 4B for a layout rule of the layout structure 200 of the invention, and FIG. 4A and FIG. 4B respectively illustrate configuration methods of the inner leading wires and the outer leading wires of the layout structure of the embodiment of the invention. In FIG. 4A, the layout structure 401 carries a central processing unit (CPU) 410, an embedded multimedia card chip 420, a power management integrated circuit (PMIC) 430 and a memory chip 440. The CPU 410 and the embedded multimedia card chip 420 are connected to each other through inner leading wires IL41-IL43, and perform information or power transmission between each other. The CPU and the memory chip 440 are connected to each other through inner leading wires IL44-IL45, and perform information or power transmission between each other. The embedded multimedia card chip 420 and the PMIC 430 are connected to each other through an inner leading wire IL46, and perform information or power transmission between each other.

It should be noted that the inner leading wires IL41-IL46 are required to be integrally disposed in the distribution range RG of the layout structure 401. Taking an inner leading wire IL47 as an example, a part of the inner leading wire IL47 connected between the CPU 410 and the PMIC 430 is disposed outside the distribution range RG of the layout structure 401, which is an inner leading wire not complied with the rule. Moreover, voltage rail wires and critical path wires between the chips carried by the layout structure 401 may all be configured in the manner of the inner leading wires, so as to ensure signal and power transmission quality.

Moreover, regarding a layout rule of the outer leading wires, the outer leading wires of the embodiment of the invention have to obey a rule of single-in single-out. In FIG. 4B, a plurality of chips 450-480 is carried by a layout structure 402, where the chip 450 performs a signal and power transmission operation with external through the outer leading wires OL41 and OL42. After the outer leading wires OL41 and OL42 leaves the distribution range RG of the layout structure 402, some of the wires return back to the distribution range RG of the layout structure 402, which is a practice not complied with the rule.

Moreover, regarding the outer leading wires OLA3 and OLA4 coupled to the chip 460, the outer leading wires OLA3 and OLA4 are respectively used for transmitting signals and power. Moreover, the outer leading wires OLA3 and OLA4 are arranged in the manner of single-in single-out relative to the distribution range RG of the layout structure 402. The outer leading wires OLA3 and OLA4 are outer leading wires complied with the rule.

Namely, the number of times that each of the outer leading wires of the layout structure 401 passes through the one or more edges of the distribution range RG of the layout structure 401 is not greater than 1.

On the other hand, an extending direction D1 of the outer leading wires OLA3 and OLA4 is substantially orthogonal to an extending direction D2 of the one or more edges corresponding to the inner layer connection pads connected to the outer leading wires OLA3 and OLA4.

Moreover, in FIG. 4B, when the outer leading wires OLA3-OLA5 connected to the chip 460 are mobile industry processor interface (MIPI) wires, the outer leading wires OLA3-OLA5 are arranged in an orthogonal junction manner within the distribution range RG of the layout structure 402. When the outer leading wires OLA6-OLA8 connected to the chip 470 are general purpose input output (GPIO) interface wires, the outer leading wires OLA6-OLA8 are also arranged in the orthogonal junction manner within the distribution range RG of the layout structure 402.

Figure 5:
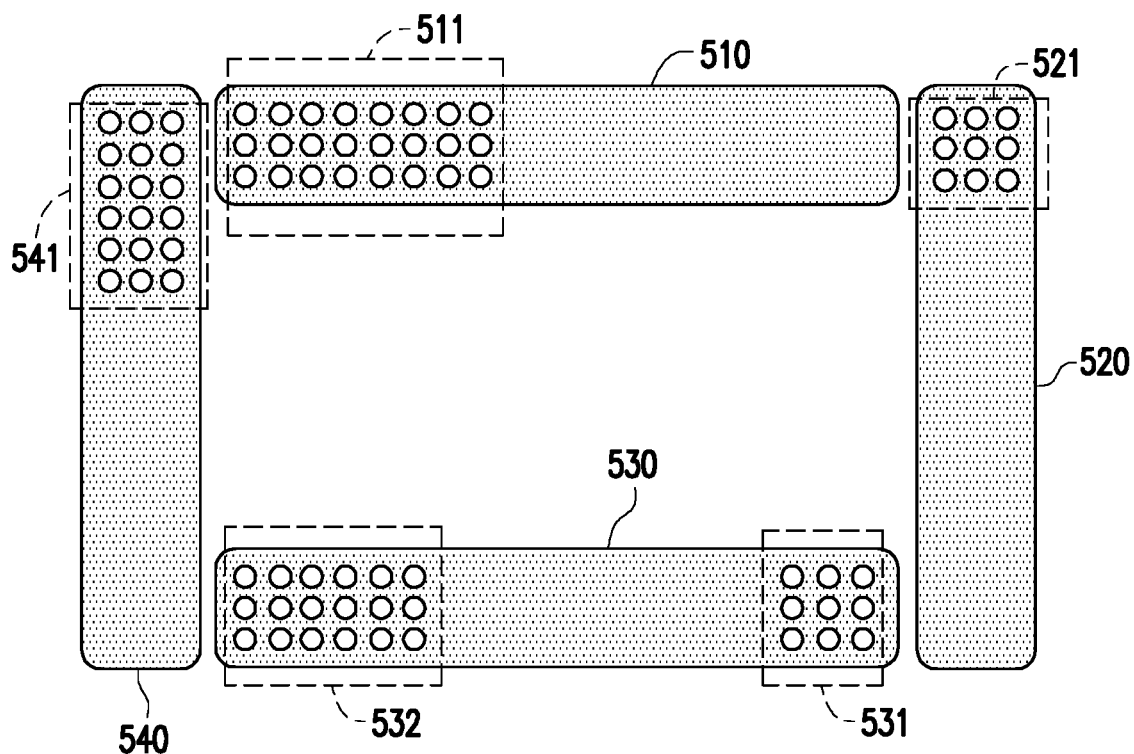
FIG. 5 is a schematic diagram of inner layer connection pads of a layout structure according to an embodiment of the invention.

Referring to FIG. 5, FIG. 5 is a schematic diagram of inner layer connection pads of a layout structure according to an embodiment of the invention. The inner layer connection pads of the layout structure of the embodiment of the invention are disposed on the one or more edges of the distribution range. For example, the distribution range of the layout structure has 4 edges, where the 4 edges respectively have cross-sectional structures 510-540. The inner layer connection pads are divided into a plurality of connection points groups 511, 521, 531, 532 and 541 corresponding to a plurality of signal types. In the present embodiment, the connection point group 511 is disposed on the cross-sectional structure 510 of the distribution range, the connection point group 521 is disposed on the cross-sectional structure 520 of the distribution range, the connection point groups 531 and 532 are disposed at two sides of the cross-sectional structure 530 of the distribution range, and the connection point group 541 is disposed on the cross-sectional structure 540 of the distribution range. The outer leading wires connected to the connection point group 511 may be transmission wires of the MIPI used for transmitting display data of a display device; the outer leading wires connected to the connection point group 521 may be transmission wires of a universal serial bus (USB); the outer leading wires connected to the connection point group 531 may be transmission wires for radio frequency (RF) signal input output; the outer leading wires connected to the connection point group 532 may be transmission wires of the GPIO interface; and the outer leading wires connected to the connection point group 541 may be transmission wires of the MIPI of an image capturing device (for example, a camera, a video camera).

Through the aforementioned grouping method, regarding the signals (or power) transmitted by the outer leading wires, an interference state thereof caused by different types of signals (or power) may be effectively decreased, so as to ensure the quality of the signals (or power) transmitted by the outer leading wires.

It should be noted that the inner layer connection pads may be respectively disposed on different metal layers, and the metal layers respectively correspond to a plurality of metal layers provided by the connected circuit board.

Figure 6:
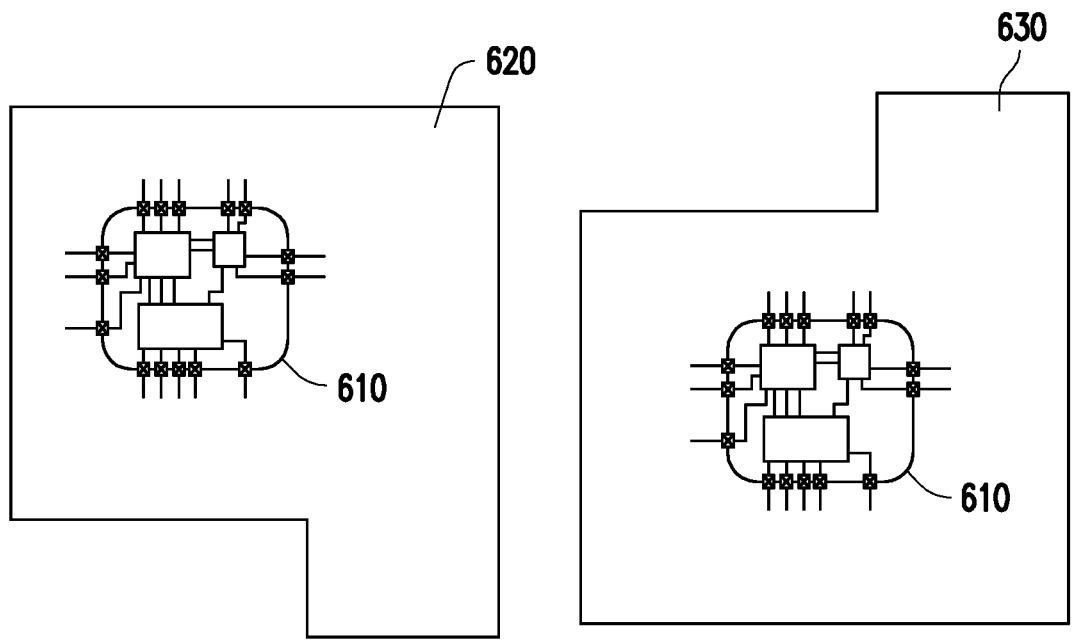
FIG. 6 is a schematic diagram of an application of the layout structure according to an embodiment of the invention.

Referring to FIG. 6, FIG. 6 is a schematic diagram of an application of the layout structure according to an embodiment of the invention. The layout structure 610 of the vSOM of the embodiment of the invention may be disposed on a plurality of circuit boards with the same type, or may be disposed on a plurality of circuit boards with different types. In FIG. 6, the layout structure 610 may be disposed on a circuit board 620, or may be disposed on a circuit board 630, where the circuit board 620 and the circuit board 630 are different circuit boards, and the layout structure 610 configured on the circuit board 620 and the layout structure 610 configured on the circuit board 630 are completely the same, and have the same distribution range.

It should be noted that since the layout structures 610 on the circuit boards 620 and 630 are the same, under the premise that the layout structure 610 has completed the authentication, when the circuit boards 620 and 630 executes the authentication operation, it is unnecessary to perform authentication to the entire circuit boards. In this way, the cost and time required for the authentication are reduced.

Figure 7:
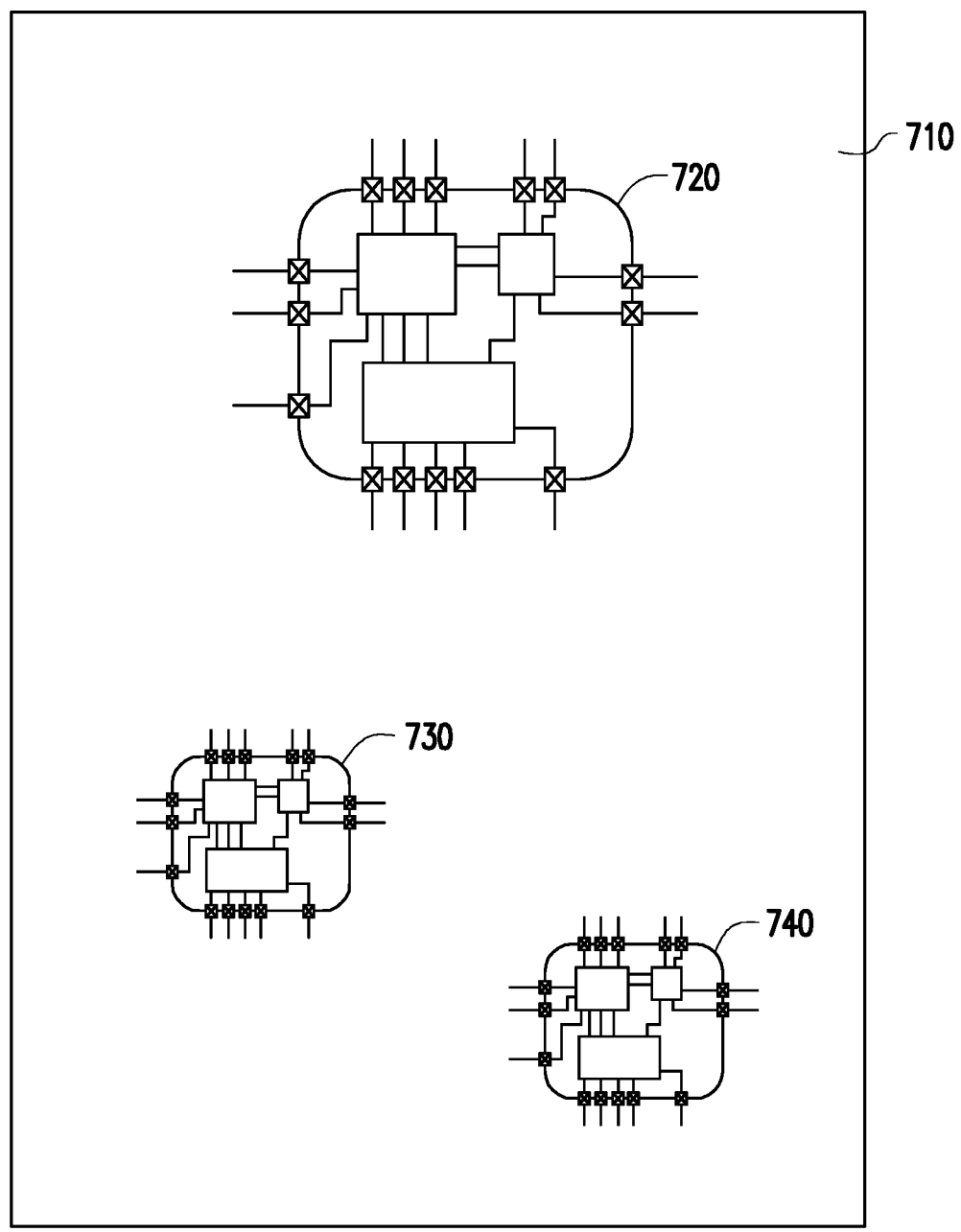
FIG. 7 is a schematic diagram of another application of the layout structure according to an embodiment of the invention.

Referring to FIG. 7, FIG. 7 is a schematic diagram of another application of the layout structure according to an embodiment of the invention. In FIG. 7, a plurality of layout structures 720-740 of the vSOM of the embodiment of the invention may be disposed on a single circuit board 710. The layout structures 730 and 740 may be the same, and the layout structures 720 and 730 may be different. Namely, a plurality of the same or different layout structures 720-740 of the vSOM may be disposed on the same circuit board 710, so as to simplify the layout complexity of the circuit board 710.

In summary, the invention provides the layout structure of the vSOM, and by configuring the layout structure of the vSOM on the applied circuit board, the height of the circuit board is not influenced. Moreover, through configuration of the layout structure of the vSOM, the design complexity of the circuit board of the electronic device may be decreased, and the authentication cost and authentication time required for the circuit board may be decreased.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A layout structure, comprising:
   a plurality of chip carrying areas, respectively carrying a plurality of chips; and
   a plurality of inner layer connection pads, disposed on at least one edge of the layout structure;
   wherein the layout structure has a plurality of outer leading wires, and all outer leading wires of the layout structure are disposed between the inner layer connection pads and the chip carrying areas,
   wherein the layout structure is disposed on at least one first circuit board and is connected to a plurality of wires of the at least one first circuit board through the outer leading wires, and the outer leading wires and the wires of the at least one first circuit board are formed by sharing at least one first metal layer,
   wherein an extension direction of each of the all outer leading wires in the layout structure is orthogonal to an extension direction of the at least one edge corresponding to the corresponding inner layer connection pad.

2. The layout structure as claimed in claim 1, further comprising a plurality of inner leading wires disposed between the chip carrying areas, wherein the layout structure has a distribution range, and the chip carrying areas and the inner leading wires are all integrally disposed in the distribution range.

3. The layout structure as claimed in claim 2, wherein the inner layer connection pads are disposed on the at least one edge of the distribution range.

4. The layout structure as claimed in claim 3, wherein the inner layer connection pads are divided into a plurality of connection point groups corresponding to a plurality of signal types, and the connection point groups are respectively disposed in a plurality of regions of the at least one edge.

5. The layout structure as claimed in claim 2, wherein the inner leading wires comprise a plurality of voltage rail wires and at least one critical path wire, wherein the voltage rail wires are used for providing a power voltage to the chip carrying areas.

6. The layout structure as claimed in claim 2, wherein each of the outer leading wires is a mobile industry processor interface (MIPI) wire, a general purpose input output (GPIO) interface wire, a radio frequency (RF) signal input output wire or a serial transmission interface wire.

7. The layout structure as claimed in claim 6, wherein when each of the outer leading wires is the mobile industry processor interface (MIPI) wire or the general purpose input output (GPIO) interface wire, each of the outer leading wires is arranged in an orthogonal junction manner within the distribution range.

8. The layout structure as claimed in claim 2, wherein the number of times that each of the outer leading wires passes through the at least one edge of the distribution range of the layout structure is not greater than 1.

9. The layout structure as claimed in claim 1, wherein each of the chip carrying areas is used for carrying a central processing unit, a power management integrated circuit, a radio frequency signal processing chip or a memory chip.

10. The layout structure as claimed in claim 1, wherein the layout structure is further disposed on at least one second circuit board, and the at least one first circuit board and the at least one second circuit board are different,
    wherein the layout structure is connected to a plurality of wires of the at least one second circuit board through the outer leading wires, and the outer leading wires and the wires of the at least one second circuit board are arranged by sharing at least one second metal layer.

11. The layout structure as claimed in claim 10, wherein distribution range of the layout structure on the at least one first circuit board and on the at least one second circuit board are the same.

12. A circuit board, comprising:
    a plurality of wires; and
    at least one layout structure, comprising:
      a plurality of chip carrying areas, respectively carrying a plurality of chips;
      a plurality of inner layer connection pads, disposed on at least one edge of the layout structure; and
      a plurality of outer leading wires, disposed between the inner layer connection pads and the chip carrying areas,
    wherein all outer leading wires of the layout structure are disposed between the inner layer connection pads and the chip carrying areas,
    wherein the layout structure is disposed on the circuit board and is connected to the wires of the circuit board through the outer leading wires, and the outer leading wires and the wires of the circuit board are formed by sharing at least one first metal layer,
    wherein an extension direction of each of the all outer leading wires in the layout structure is orthogonal to an extension direction of the at least one edge corresponding to the corresponding inner layer connection pad.

13. The circuit board as claimed in claim 12, wherein the layout structure further comprises a plurality of inner leading wires disposed between the chip carrying areas, wherein the layout structure has a distribution range, and the chip carrying areas and the inner leading wires are all integrally disposed in the distribution range.

14. The circuit board as claimed in claim 13, wherein the inner layer connection pads are disposed on the at least one edge of the distribution range.

15. The circuit board as claimed in claim 14, wherein the inner layer connection pads are divided into a plurality of connection point groups corresponding to a plurality of signal types, and the connection point groups are respectively disposed in a plurality of regions of the at least one edge.

16. The circuit board as claimed in claim 13, wherein the inner leading wires comprise a plurality of voltage rail wires and at least one critical path wire, wherein the voltage rail wires are used for providing a power voltage to the chip carrying areas.

17. The circuit board as claimed in claim 13, wherein when each of the outer leading wires is the mobile industry processor interface (MIPI) wire or the general purpose input output (GPIO) interface wire, each of the outer leading wires is arranged in an orthogonal junction manner within the distribution range.

18. The circuit board as claimed in claim 13, wherein the number of times that each of the outer leading wires passes through the at least one edge of the distribution range of the layout structure is not greater than 1.

* * * * *